United States Patent [19]

Moore et al.

[11] Patent Number: 4,845,474
[45] Date of Patent: Jul. 4, 1989

[54] SMOKE AND FIRE DETECTOR

[75] Inventors: Prentice G. Moore, Clearwater; Stanley J. Brooks, Palm Harbor, both of Fla.

[73] Assignee: Pioneer Manufacturing, Inc., St. Petersburg, Fla.

[21] Appl. No.: 892,668

[22] Filed: Aug. 1, 1986

[51] Int. Cl.$^4$ ............................................. G08B 17/10
[52] U.S. Cl. .................................. 340/629; 340/628; 340/384 E; 250/381; 250/384
[58] Field of Search .......... 340/629, 628, 630, 384 R, 340/384 E; 361/331; 250/381, 382, 384

[56] References Cited

U.S. PATENT DOCUMENTS

| | | | |
|---|---|---|---|
| 4,075,487 | 2/1978 | Larsen | 340/629 |
| 4,223,305 | 9/1980 | Arima | 340/629 |
| 4,238,788 | 12/1980 | Rosauer et al. | 340/629 |
| 4,282,520 | 8/1981 | Shipp et al. | 340/629 |
| 4,306,299 | 12/1981 | Tamura et al. | 340/629 |
| 4,383,253 | 5/1983 | Lam et al. | 340/629 |
| 4,471,346 | 9/1984 | Nelson et al. | 340/629 |
| 4,484,181 | 11/1984 | Schwartz | 340/629 |
| 4,574,272 | 3/1986 | Brown | 340/384 R |
| 4,595,914 | 6/1986 | Siegel | 340/629 |
| 4,604,606 | 8/1986 | Sweany | 340/384 R |

*Primary Examiner*—John W. Caldwell, Sr.
*Assistant Examiner*—Tyrone Queen
*Attorney, Agent, or Firm*—Jones, Day, Reavis & Pogue

[57] ABSTRACT

An ionization smoke and fire detector comprises a molded plastic housing that includes a nodal ring for supporting a vibrating plate that is part of an alarm. The alarm may be driven by piezoelectricity or by an electromechanical device. If the detector is battery powered, a portion of the housing is cut out to permit removal and insertion of a battery holder that makes contact automatically upon insertion to supply electric power to the electronic circuit of the smoke detector. One electrode of a reference chamber for the smoke detector is formed by wave-soldering an open metallized area on the printed-circuit board. Contact with the movable element of the alarm and with a high-impedance input in an integrated circuit are made through springs that are not soldered or welded. The outside of the smoke and fire detector is formed in part by a smoke-chamber cover which makes various electrical contacts with the printed-circuit board at electrical conductors that are bent around the edge of the board and wave-soldered. The smoke and fire detector is assembled without screws and all electrical connections among components are made without welding, hand soldering, or any soldering beyond wave soldering of a printed-circuit board.

7 Claims, 5 Drawing Sheets

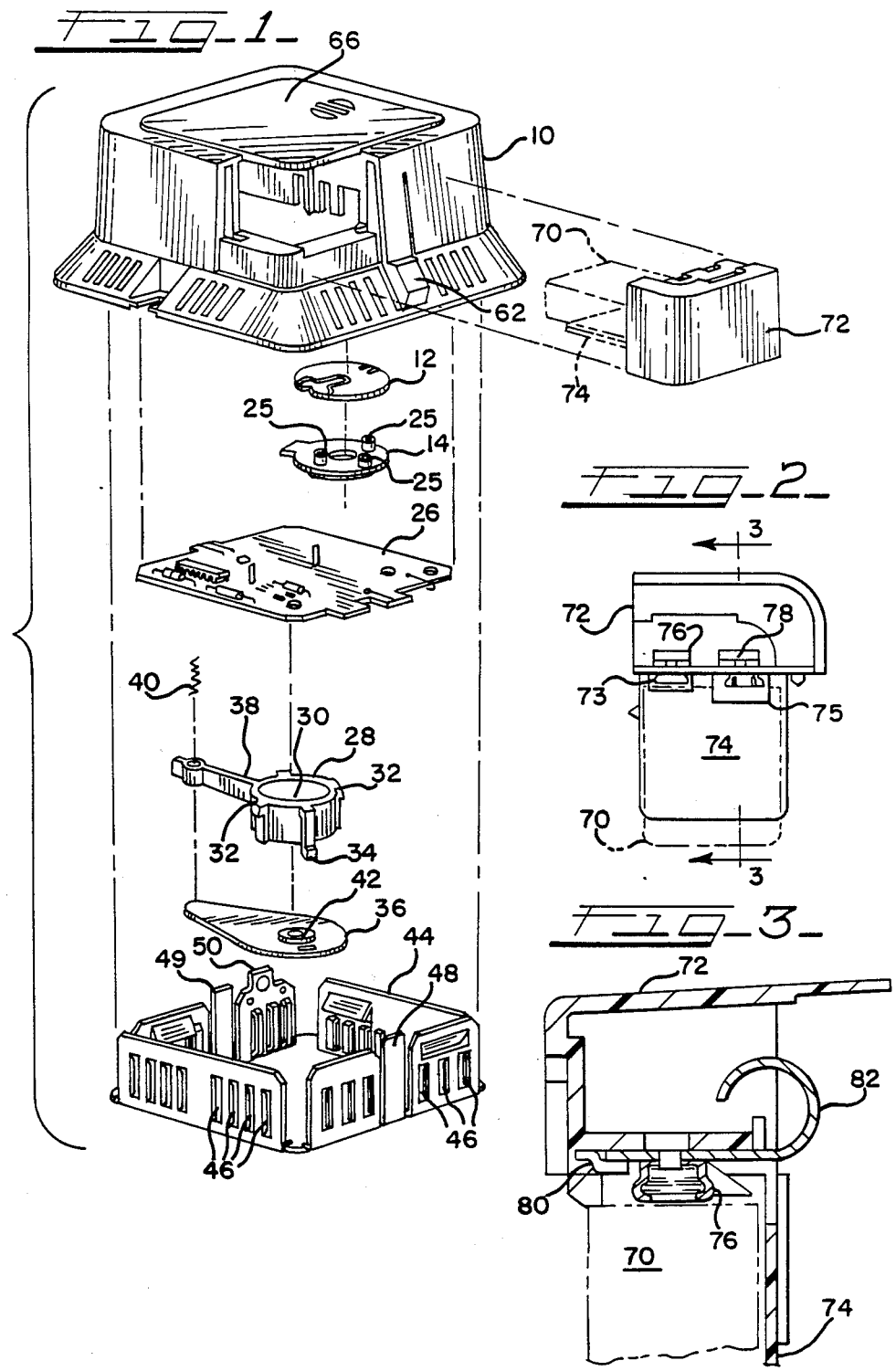

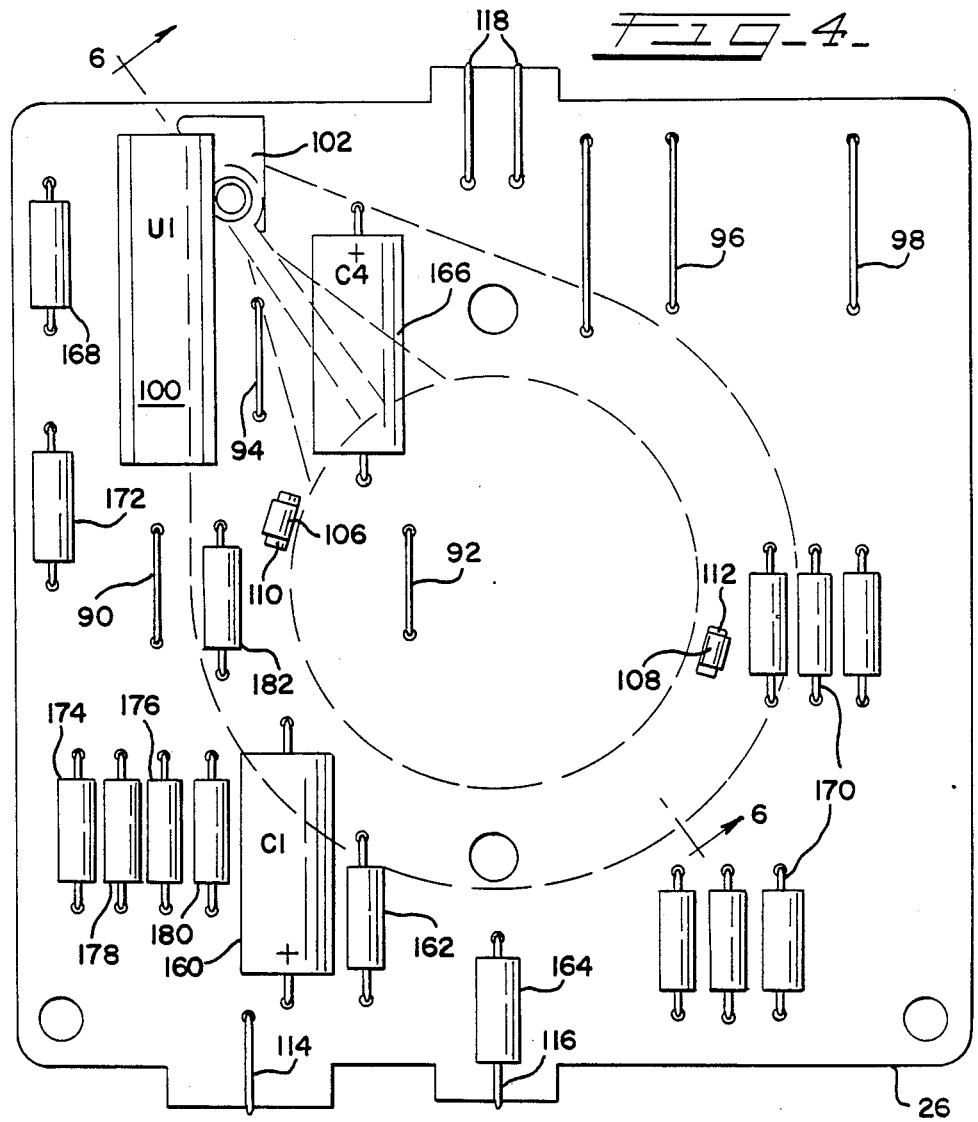
FIG-4-
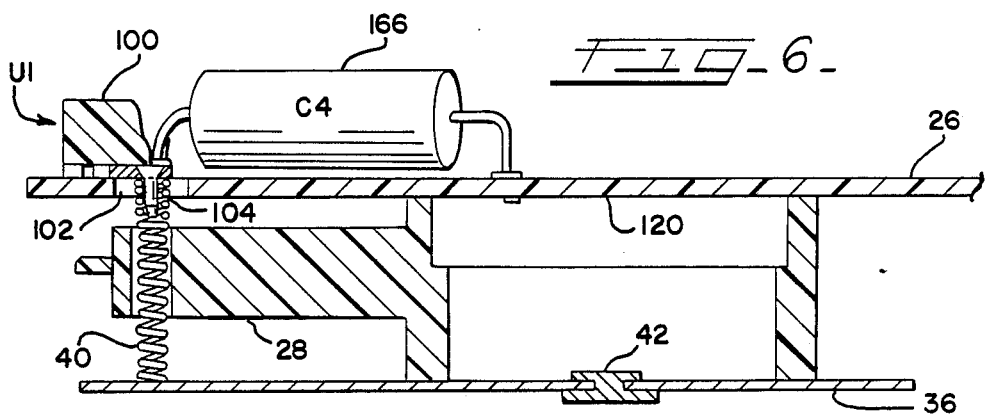
FIG-6-

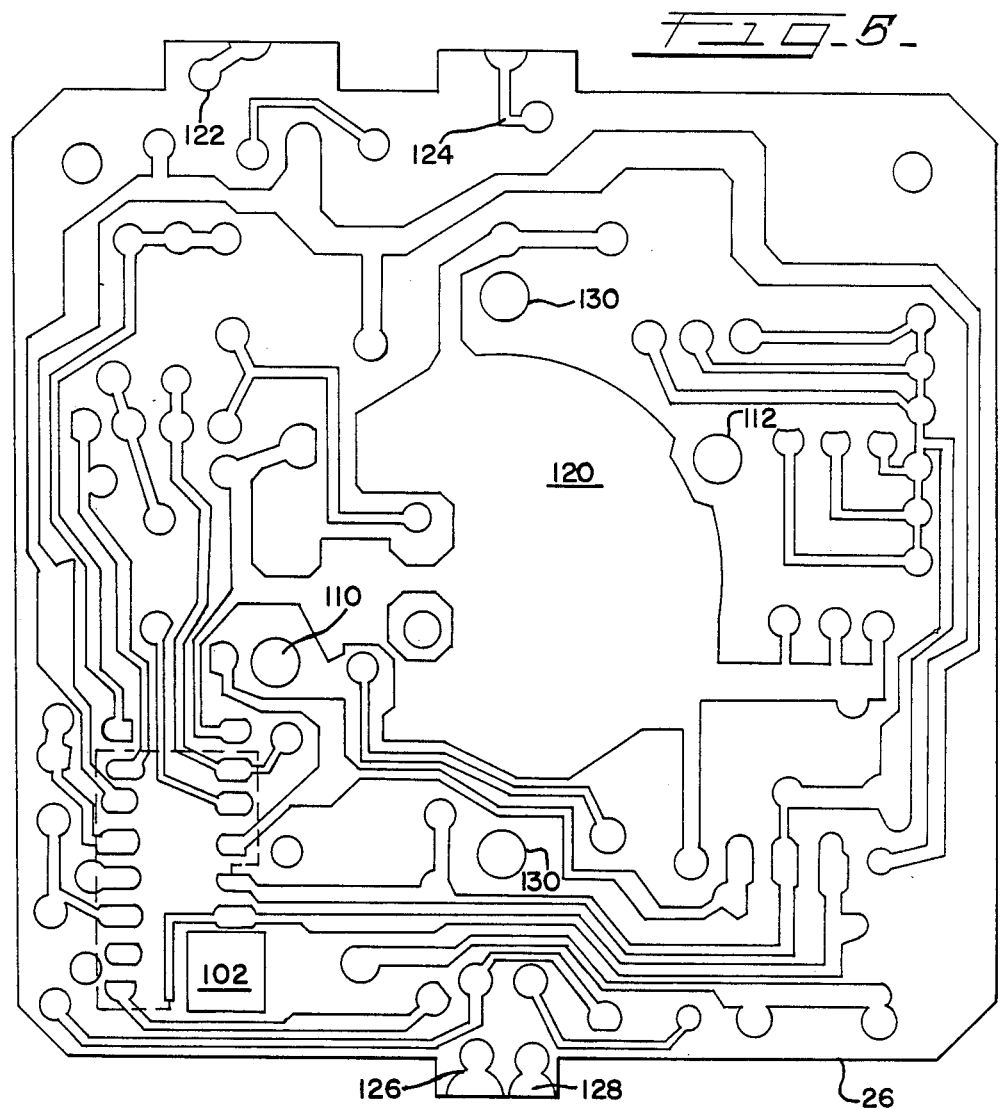
FIG. 5
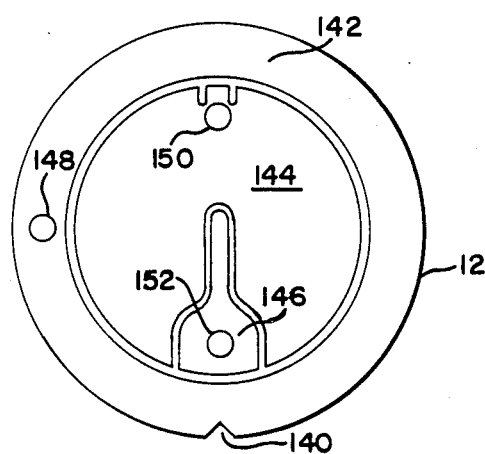

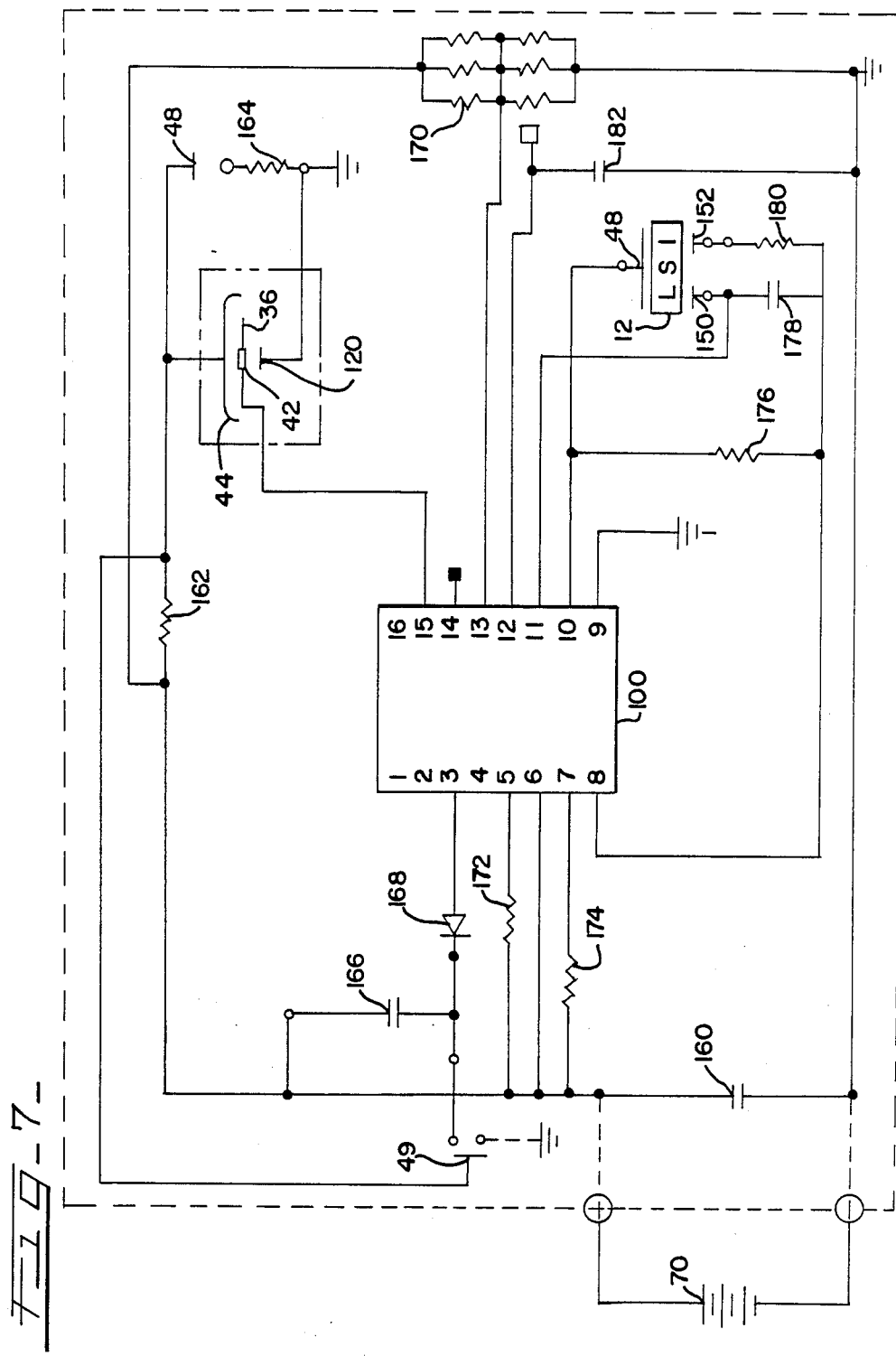

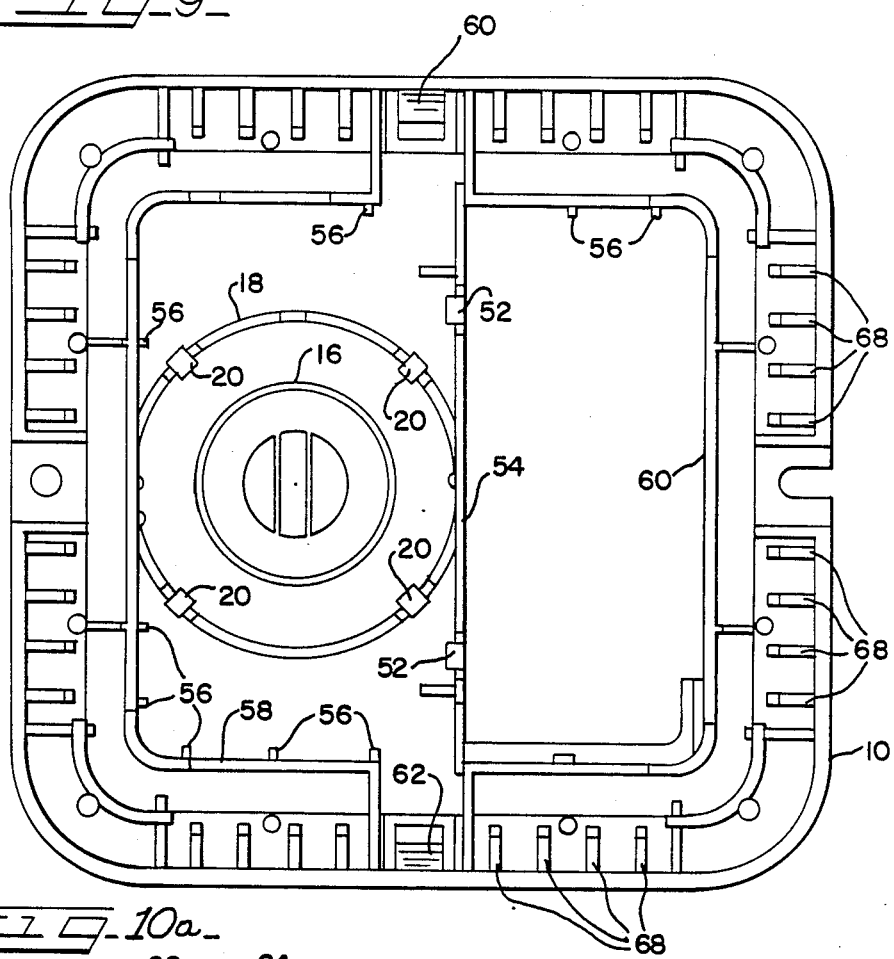
FIG_9_
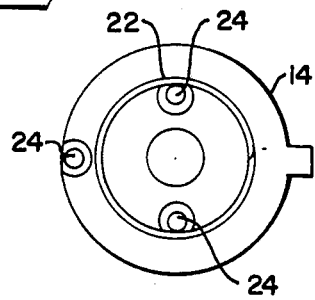
FIG_10a_
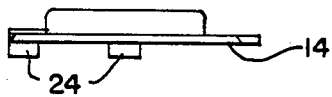
FIG_10b_

SMOKE AND FIRE DETECTOR

BACKGROUND OF THE INVENTION

This invention relates to smoke and fire detectors. In particular, it is an improved smoke and fire detector that operates on the ionization principle.

Two types of smoke and fire detectors are in common use to provide warning signals to people in living spaces. These are photoelectric detectors and ionization detectors. The photoelectric detector responds to changes in light transmission through a medium that contains smoke. The ionization smoke detector responds to changes in the conductivity of an ionized medium due to the presence of combustion products. The present invention is an improvement in the ionization smoke and fire detector.

The principal features of an ionization smoke and fire detector include a smoke chamber, a reference chamber, means for ionizing air in each of the chambers, means for detecting a difference in the flow of current through the chambers, and means for sounding an alarm when that difference exceeds a predetermined amount. Both the smoke chamber and the reference chamber admit ambient air but the two must be designed so that circulation is much slower in the reference chamber, while the smoke chamber adapts quickly to changes in ambient conditions. This allows both chambers to change conductivity in response to relatively slow changes in the ambient atmosphere, most particularly changes in the relative humidity, but causes a differential response in the smoke chamber, which responds more quickly to sudden changes in ambient conditions.

Smoke and fire detectors require electrical energy to operate. This may be supplied either by a battery or by the AC power line. It is often desirable to design the smoke detector to operate at the relatively low voltage of a battery and to use a rectifier and dropping resistor to reduce the line voltage to the order of the battery voltage. This allows the same low-voltage detection and alarm circuit to be used for both battery-powered and line-powered detectors.

Important secondary features of smoke and fire detectors include some means of testing the detector, a warning of weak batteries in a battery-powered detector, and a means for silencing an alarm, either after test or after proper operation on smoke from burning toast or the like. Such a silencing feature minimizes a tendency that a person might otherwise have to remove a battery to silence a detector and thus disable it at a time of real need.

One element that has contributed to effective operation and reduced costs is the availability of a family of smoke-detector integrated circuits, the Motorola MC 14466, MC 14467, and MC 14468. These ICs combine the functions of a high-impedance comparator, a power flip-flop for driving an alarm horn, and a timing circuit for comparing the battery voltage with a reference voltage and sounding an alarm if the battery voltage is lower than the reference voltage. One problem in the use of the IC is the need for making an extremely high-impedance connection to the comparator. The comparator terminal of the IC must be carefully protected against leakage because of the extremely small currents involved. It is difficult to maintain enough electrical isolation if the appropriate pin of the IC is wave-soldered in a printed-circuit board. One solution to this problem used by some has been to bend the terminal in question at 90 degrees to the line of the pins and to weld it to a connection to the smoke chamber. This normally requires hand labor which adds to the cost of assembly of the smoke and fire detector. Wires are often used to make connections to battery terminals and to a horn or other audible alarm. These wires are usually hand soldered, adding more to the cost of assembly of the smoke and fire detector.

Another problem in the design of smoke and fire detectors is that of reducing directional sensitivity. The smoke chamber, which senses smoke to produce a signal as a part of the operation of the detector, is typically located in a portion of the interior of the housing of the smoke detector. The presence of other components in the interior of the smoke detector can interfere with the flow of smoke toward the smoke chamber. The completed detector must meet minimum standards of sensitivity with smoke supplied from the direction in which the detector is least sensitive. This increases the probability of false alarms if the ratio of the sensitivity in the direction of maximum sensitivity to that in the direction of minimum sensitivity is substantially different from unity.

SUMMARY OF THE INVENTION

It is an object of the present invention to provide an ionization smoke and fire detector of substantially equal sensitivity for all directions of incidence of smoke.

It is a further object of the present invention to provide an ionization smoke and fire detector in which all electronic components are insertable by machine into a printed-circuit board for wave-soldering.

It is a further object of the present invention to provide a battery-powered ionization smoke and fire detector in which no part of the mechanism of the smoke and fire detector is exposed to a person changing a battery.

It is a further object of the present invention to provide an ionization smoke and fire detector that is screened to minimize access by insects to the entire smoke detector and not just to an ionization chamber that is a part of the detector.

It is a further object of the present invention to use a wave-soldered portion of a printed-circuit board as part of an ionization chamber.

It is a further object of the present invention to provide an ionization smoke and fire detector in which part of a noise-making assembly is molded as a part of a unitary housing.

It is a further object of the present invention to provide an ionization smoke and fire detector in which shielding of a printed-circuit board and its components against radio-frequency interference is effected by a cover of a smoke chamber.

It is a further object of the present invention to screen insects from the operating components on the interior of the smoke and fire detector by the same screening system that keeps insects from the smoke chamber.

Other objects will become apparent in the course of a detailed description of the invention.

An ionization smoke and fire detector comprises a molded plastic housing that includes a nodal ring for supporting a vibrating plate that is part of an alarm. The alarm may be driven by piezoelectricity or by an electromechanical device. If the detector is battery-powered, a portion of the housing is cut out to permit removal and insertion of a battery holder that makes contact automatically upon insertion to supply electric power to the electronic circuit of the smoke detector. One electrode of a reference chamber for the smoke detector is formed by wave-soldering an open metallized area on the printed-circuit board. Contact with the movable element of the alarm and with a high-impedance input in an integrated circuit are made through springs that are not soldered or welded. The outside of the smoke and fire detector is formed in part by a smoke-chamber cover which makes various electrical contacts with the printed-circuit board at electrical conductors that are bent around the edge of the board and wave-soldered. The cover encloses components to provide r-f shielding. The smoke and fire detector is assembled without screws and all electrical connections among components are made without welding, hand soldering, or any soldering beyond wave soldering of a printed-circuit board.

BRIEF DESCRIPTION OF THE DRAWINGS

FIG. 1 is an exploded perspective view of the smoke and fire detector of the present invention and its internal components.

FIG. 2 is a top view of the battery holder for the smoke and fire detector of the present invention.

FIG. 3 is a partial sectional view of the battery holder of FIG. 2, taken along section line 3—3.

FIG. 4 is a top view of the printed-circuit board of the smoke and fire detector of the present invention showing assembled components.

FIG. 5 is a bottom view of the printed-circuit board of FIG. 4 showing interconnections in the absence of components.

FIG. 6 is a partial sectional view of the printed-circuit board of FIG. 4 taken along section lines 6—6.

FIG. 7 is a schematic diagram of the electrical circuit represented by the printed-circuit board of FIG. 4.

FIG. 8 is a top view of the transducer of FIG. 1.

FIG. 9 is a plan view of the housing of FIG. 1.

FIG. 10a is a plan of the retainer of FIG. 1.

FIG. 10b is an elevation of the retainer of FIG. 1.

DETAILED DESCRIPTION OF THE INVENTION

FIG. 1 is an exploded perspective view of the smoke and fire detector of the present invention and its components and FIG. 9 is a plan view of housing 10 of FIG. 1 with most of the components removed. In FIGS. 1 and 9 a transducer 12 is supported in place by a retainer 14 that holds transducer 12 against a ring 16 that is molded as a part of case 10. Transducer 12 is aligned by detent 17 of case 10. Transducer 12 is shown here reversed from its proper orientation, to show regions in which piezoelectric material is deposited. In the alternative, transducer 12 may be driven by an interrupted electromagnet. Retainer 14 is held in place inside ring 18 by a plurality of spring clips 20. Ring 18 and spring clips 20 are also molded as a part of housing 10 which is typically made of a dimensionally stable electrically insulating engineering plastic such as ABS or the like.

Further understanding of the design and functioning of retainer 14 can be had by reference to FIGS. 10a and 10b which are a plan and elevation respectively of retainer 14. Retainer 14 is typically made of a material similar to or identical with that of housing 10. In FIGS. 10a and 10b a ring, 22 is molded as a part of retainer 14. Ring 22 has the same diameter as ring 16 so that when retainer 14 is placed so as to be held by spring clips 20, rings 16 and 22 are substantially coaxial. Rings 16 and 22 are also designed to be placed at a node of a circular mode of oscillation of transducer 12 so that when transducer 12 is caused to vibrate, as by the application of electrical signals to the piezoelectric material that is disposed on transducer 12 for the purpose, the support provided transducer 12 by rings 16 and 22 will exhibit a minimum amount of mechanical interference with the motion of transducer 12. This both minimizes wear and contributes to the production of smoke detectors producing alarms at a uniform sound level.

FIGS. 10a and 10b also show three holes 24 that pass through retainer 14. Referring again to FIG. 1, holes 24 of FIG. 10 permit coil springs 25 to pass through retainer 14, which is typically molded of an electrically insulating plastic such as ABS or the like, and make electrical contact between appropriate portions of transducer 12 and printed circuit board 26. The components described so far are readily adapted to machine insertion to construct a device that produces an audible alarm and also to assemble its electrical contacts to the printed circuit board 26 that controls the generation of that alarm.

Continuing with the exploded diagram of FIG. 1., insulator 28 is a component, typically molded of an insulating plastic such as Noryl SE100, a trademark for a dimensionally stable engineering plastic. Other such insulating plastics could also be used. Insulator 28 includes a generally cylindrical enclosure 30 that will comprise part of the reference chamber for the smoke detector. This is a volume of space that is connected to the ambient atmosphere of the smoke detector in such a way as to permit enough circulation to allow the reference chamber to maintain ambient atmospheric pressure and humidity. However, that circulation should be reduced sufficiently so that when smoke is introduced into the smoke detector, conditions inside the reference chamber do not change immediately. In the preferred embodiment, insulator 28 is molded in one piece to provide spring clips 32 for attachment to printed circuit board 26 and spring clips 34 for attachment to source plate 36. An arm 38 that is also molded as a part of insulator 28 includes a guide 39 for a coil spring 40 that makes electrical contact between source plate 36 and a component that is attached to printed-circuit board 26. Source plate 36 contains a two-sided radioactive source 42 that is typically swaged, headed or otherwise pressed into source plate 36, which is typically made of galvanized steel or the like. The side of source plate 42 that is connected to insulator 28 emits radiation into enclosure 30 to ionize a portion of the air and any suspended particles in enclosure 30. This permits the flow of electric current through enclosure 30 between source plate 36 and a portion of printed circuit board 26 when a voltage is applied between them. It is convenient to provide a printed conducting surface on printed circuit board 26. After wave soldering, that surface becomes an electrode that substantially completes enclosure 30 when insulator 28 is snapped into place in printed circuit board 26.

The side of source plate 36 that is opposite to the one shown in FIG. 1 exposes a second side of radioactive source 42. This emits ionizing radiation into the smoke chamber, a region that is defined by printed-circuit board 26, the outside of insulator 28, and smoke-chamber cover 44. In the preferred embodiment, cover 44 is formed of a single piece of a metal such as galvanized steel or the like. It includes a plurality of openings 46 to admit smoke into the smoke chamber. Cover 44 also includes a plurality of tabs 48 and 49 that can be bent into contact with connections on printed circuit board 26 to effect electrical contacts. Two such tabs 48 and 49 are shown in FIG. 1 because in the preferred embodiment of the present invention it has proved desirable to have one control as a push-to-test and another as a push-to-silence. Cover 44 also includes a plurality of formed parts 50 for making electrical contact with printed circuit board 26. A particularly useful way of making such contacts is to insert and wave-solder bare wires or component leads that are bent around the outside of printed circuit board 26. Details of this feature will be shown later.

Referring again to FIG. 9, printed circuit board 26 is inserted on spring snaps 52 which hold it against wall 54 and ribs 56. Spring snaps 52 are molded as a part of housing 10. Thus, transducer 12 is secured by retainer 14 to housing 10. Printed circuit board 26 is secured by snaps 52 to housing 10. Insulator 28 is secured by snaps to printed-circuit board 26, and source plate 36 is secured by snaps to insulator 28. The entire assembly thus described lends itself very effectively to mechanical insertion of components with resulting economy of manufacture. Assembly of the parts described so far is then completed by inserting cover 44 so that it is outside wall 58 and wall 60. Cover 44 may be secured to housing 10 by raised sharp tabs 61 that permit insertion but jam upon attempted removal. Tabs 48 are placed so that they are opposite strips 62 and 64. Strips 62 and 64 are molded in housing 10 so that they are cantilevered from their ends near surface 66 of FIG. 1. This is the surface that will be the bottom of the smoke detector of the present invention when it is mounted on the ceiling of a room. Strip 62 is shown in FIG. 1 and FIG. 9 while strip 64 is out of sight in the perspective of FIG. 1 but shows in FIG. 9. When the free end of strip 62 or strip 64 is pressed toward the inside of housing 10 on the assembled smoke detector, one of the tabs 48 and 49 of smoke-chamber cover 44 will be pressed toward an appropriate contact on printed circuit board 26 to complete an electrical circuit and carry out a function such as push-to-test or push-to-silence. The tabs 48 and 49 and strips 62 and 64 are bent well within their elastic limits so that they return to the open position when released.

Referring again to FIG. 9, a plurality of openings 68 is placed in housing 10 so as to combine with openings 46 of smoke-chamber cover 44 to admit smoke to the smoke chamber that is formed by the combination of smoke-chamber cover 44 and printed-circuit board 26. Openings 68 and openings 46 are sized to keep out most insects and are disposed so as to make the resulting smoke detector substantially insensitive to the direction of incidence of smoke upon the detector. Other incidental openings, as around strips 62 and 64, are also sized to keep out insects. In the smoke detector that was built and tested for the practice of the present invention, this insensitivity to direction was accomplished using eight openings 68 on each of the four sides of housing 10. Smoke-chamber cover 44 had six openings 46 on each of the two sides that contained tabs 48 and eight openings 46 on each of the remaining two sides. Dimensions of the openings 46 and 68 are listed in Table 1.

TABLE 1

| DIMENSIONS OF OPENINGS 46 and 68 | | | |
|---|---|---|---|
| OPENING 46 | | OPENING 68 | |
| LENGTH | 11.4 mm | LENGTH | 14.2 mm |
| WIDTH | 1.0 mm | WIDTH | 1.1 mm |

In the preferred embodiment of the present invention, openings 46 in smoke-chamber cover 44 were made by displacing metal in cover 44 without removing that metal. Thus, each of the openings 46 in cover 44 is a double opening and the width given in Table 1 is for each of those openings. The resultant construction represents a baffle that contributes to the lack of directional sensitivity of the resulting smoke detector.

One additional feature that has not yet been shown is necessary to make a smoke detector operational. That is to supply electrical energy to the smoke detector. In the preferred embodiment of the smoke detector that was built for the practice of the present invention, that energy was supplied by a battery 70 that is shown in the exploded view of FIG. 1 in its operating position in battery holder 72. With various modifications, the detector could be powered from the AC line or from a combination of line power and battery backup. FIG. 2 is a top view of battery holder 72 with a battery 70 in place and FIG. 3 is a sectional view of battery holder 72 along section lines 3—3 of FIG. 2. Battery holder 72 is molded of a single piece of plastic to match that used in housing 10. In battery holder 72, a shelf 74 helps the user to insert a replacement battery 70 and also provides structural support for a battery 70 when battery holder 72 is removed from housing 10. A male terminal 76 and a female terminal 78, both made of an electrically conducting metal, are disposed in battery holder 72 at a proper distance to make electrical and structural contact with a battery 70. Both male terminal 76 and female terminal 78 have projections 80 that are bent out to latch on an edge of battery holder 72 when terminals 76 and 78 are inserted. Openings 73 and 75 in shelf 74 provide clearance for insertion of terminals 76 and 78, respectively. Opening 73 is small enough that female terminal 78 will not pass through it but male terminal 76 will. This facilitates manufacture. Terminals 76 and 78 are also formed to include spring contracts 82. When battery holder 72 is inserted in place in housing 10, spring contacts 82 make an electrical connection to printed circuit board 26 to supply energy to operate the smoke detector of the present invention. Battery holder 72 can be inserted and removed without detaching the rest of the smoke and fire detector from its mounted position and without exposing the internal parts of the smoke and fire detector to damage by a person changing a battery. This is a distinct advantage of the smoke and fire detector of the present invention.

FIG. 4 is a view of the component side of printed-circuit board 26 with components in place, and FIG. 5 is a view of the printed side of printed circuit board 26. This is the side opposite to the one shown in FIG. 4. FIG. 6 is a partial sectional view of the printed-circuit board 26 taken along section lines 6—6 of FIG. 4. Printed-circuit board 26 of FIGS. 4, 5 and 6 is a routine printed-circuit board with certain unusual variations. All of the components and elements on printed-circuit board 26 are adapted for mechanical insertion and the inserted components are then fixed to the board by wave-soldering in the customary manner. Those components in FIG. 4 will be identified later in connection with their function as circuit elements when the electrical circuit is described. Certain of the following features of printed circuit board 26 are unusual. These include contacts 90, 92 and 94 which are formed by machine insertion of appropriately sized pieces of bare wire into printed circuit board 26. After wave soldering, contacts 90, 92 and 94 provide the connection points at which coil springs 25 of FIG. 1 make electrical contact between transducer 12 and printed circuit board 26. It is not necessary to do any soldering to effect this connection, as springs coil 25 can be inserted in holes in retainer 14. Compressing coil springs 25 maintains the force necessary to make a proper electrical connection at contacts 90, 92 and 94. Contacts 96 and 98 are similarly formed to make electrical connections with spring contacts 82 of FIG. 3. This enables electrical energy to be brought from battery 70 to printed circuit board 26 through contacts 96 and 98.

Referring again to FIG. 1, source plate 36 is shown as having coil a spring 40 that makes electrical contact with printed-circuit board 26. That contact is shown in more detail in FIG. 6 which includes integrated circuit (IC) 100. The operation of the circuit of the smoke detector of the present invention involves a comparison of the electrical conduction through two regions of gas that are ionized by radiation from the sources in source plate 36. The currents compared are that in a reference chamber that does not contain smoke with that in a smoke chamber that may contain smoke. The currents in question are of the order of picoamperes. It is therefore necessary to be certain that the connection between source plate 36 and IC 100 exhibits a very small amount of electrical leakage. This is accomplished as shown in FIG. 6 by a cutout 102 in printed circuit board 26. Cutout 102 exposes one or more pins of IC 100 so that those pins are not soldered into electrical contact with printed circuit board 26. That contact is made as shown in FIG. 6. Coil spring 40 passes through a hole in insulator 28, through cut-out 102 and into contact with pin 104 of IC 100. Coil spring 40 is compressed by the placement of insulator 28 and source plate 36 into engagement with printed circuit board 26. Insulator 28 is affixed to printed circuit board 26 by latches 106 and 108 of FIG. 4 which pass through holes 110 and 112, respectively in printed circuit board 26. The arrangement shown in FIG. 6 may be sufficient to establish a satisfactory electrical connection between source plate 36 and pin 104 of IC 100 or it may be desirable in addition to apply a room-temperature-vulcanizable (RTV) material to minimize leakage further.

Connections between PC board 26 and smoke-chamber cover 44 are made in similar fashion at three locations. Each of these connections is made by bending an electrical conductor, either a bare wire or a portion of the lead of a component, around the edge of PC board 26 before the wave-soldering process. The electrical connection of smoke-chamber cover 44 to PC board 26 is made as a result of a continuous contact between smoke-chamber cover 44 and contact 114 of FIG. 4. Tabs 48 and 49 of smoke-chamber cover 44 were illustrated in FIG. 1. Tab 48 moves in response to a push-to-test and is caused thereby to make an electrical connection at contact 116. The tab 49 that causes a push-to-silence signal makes an electrical connection with PC board 26 at contacts 118. Contacts 114, 116 and 118 represent the last of the electrical connections to be made in the construction of the smoke detector of the present invention. All of the assembly described so far has represented the insertion of parts that were wave-soldered or the insertion of other components that can be placed mechanically. None of the electrical connections involves any special bending of IC leads, any welding, or any soldering beyond the wave-soldering process. This provides the opportunity for significant savings in manufacturing the smoke detector.

FIG. 5, showing the printed side of PC board 26, shows a number of routine connections that do not require comment and some features that are of particular interest. One of particular interest is region 120, a relatively large area of deposited conductor that is covered with solder in the wave-soldering process, that serves as an electrode for the smoke chamber. Referring to FIG. 6, region 120 is indicated as being a portion of the surface of PC board 26 that is inside the enclosure of insulator 28. This use of the deposited metal on PC board 26 also contributes to ease of manufacture of the smoke detector. FIG. 5 also shows conductor 122 which is taken to and around the edge of PC board 26 to permit it to be connected to contact 114. Conductor 124 is similarly taken to and around the edge of PC board 26 to permit its connection by wave-soldering to contact 116. Conductors 126 and 128 serve the same function with respect to contacts 118. Cut-out 102 is also visible in FIG. 5. This is the portion of PC board 26 that is removed to prevent contact of PC board 26 with two of the pins of IC 100 which does not appear in FIG. 5. FIG. 5 also shows a pair of holes 130 that receive and engage the snaps 52 of FIG. 9 to secure PC board 52 to housing 10. The function of holes 110 and 112 has already been described as securing latches 106 and 108 of insulator 28 to PC board 26.

FIG. 8 is an enlarged view of the portion of transducer 12 that is disposed away from housing 10 of FIG. 1. In FIG. 8 a locating notch 140 is cut in the generally circular periphery of transducer 12 to engage detent 17 of case 10. Three regions of deposited piezoelectric material are shown in FIG. 12, separated by bare metal. Region 142 is one contact region and region 144 is another contact region. The smallest of the three regions is region 146 which is a feedback region. Electrical contact to transducer 12 is made by the three coil springs 25 of FIG. 1 at locations 148, 150, and 152. Transducer 12 is set into oscillation by the application of a proper AC electrical signal between locations 148 and 150. Current flow is in at one of the locations such as location 148, through the piezoelectric material that is deposited there, through the metal of transducer 12 and through the piezoelectric material in region 144, through that material at location 150 and into contact with another coil spring 25 at location 150. A feedback signal is similarly coupled from a coil spring 25 through the piezoelectric material of region 146 at location 150. Current again flows through the metal of transducer 12 and completes the circuit at either location 148 or 150˙ depending upon the wiring of the circuit. Current flow of an appropriate magnitude and frequency through the piezoelectric material of transducer 12 causes the physical oscillations of transducer 12 that produce the alarm of the smoke detector.

FIG. 7 is a circuit diagram of the electronic circuit that was used in the smoke detector of the present invention. In FIG. 7, battery 70 supplies power to the circuit. Battery 70 is connected in parallel with capacitor 160, which smooths power pulses when the detector sounds an alarm, at which times it draws a relatively large current. The positive terminal of battery 70 is the B-plus voltage for the circuit and the negative terminal of battery 70 is the common connection. The B-plus voltage is connected to pin 6 of IC 100. In the circuit that was built for the practice for the present invention, IC 100 was a Motorola MC14467 smoke detector chip that combines the functions of a high-impedance differential amplifier, a power flipflop to drive a horn at a frequency of about 3 KHZ, and a low-voltage comparator that tests the input voltage about every 40 seconds and provides an alarm signal if the battery voltage is less than a predetermined value. It is convenient to use a chip such as the MC14467 which combines these functions, but the functions could equally as well be performed by discrete components in the circuit of FIG. 7.

The voltage of battery 70 is connected through resistor 162 to smoke-chamber cover 44. Cover 44 is also connected electrically to tab 48 which is the push-to-test switch. Tab 48 makes a connection with resistor 164 and thence to ground to test operation of the smoke detector. Cover 44 is also connected electrically to tab 49 which is the push-to-silence switch. Operating tab 49 applies an electrical ground to cover 44 and also to one side of capacitor 166 which is connected to the B-plus voltage. The side of capacitor 166 that is connected by tab 49 to ground is also connected to the cathode of diode 168, thence to pin 3 of IC 100. When capacitor 166 is charged, it applies a voltage at pin 3 that disables the smoke detector until the charge leaks off. This typically takes from 4 to 10 minutes.

Source plate 36 of FIG. 7 is exposed to two chambers. One, the reference chamber, is defined by region 120. This chamber is permitted to follow relatively slow changes in the ambient conditions, but does not receive sudden changes such as those represented by the smoke and combustion products of a fire. Region 120, together with source plate 36, therefore defines a reference chamber for comparison. The smoke chamber is defined by the combination of source plate 36 and smoke-chamber cover 44. The combination of the smoke chamber defined by cover 44 and source plate 36 in series with the reference chamber defined by source plate 36 and region 120 thus represents a voltage divider on the B-plus voltage. The divided voltage is taken to pin 15 of IC 100 where it is compared with the voltage at pin 13 which is derived from resistive network 170. Resistive network 170 is a series-parallel combination of six equal resistors, some or all of which are selected to provide an appropriate comparison voltage for the non-smoke voltage at pin 15 of IC 100. This is a calibration process that involves selecting those resistors of resistive network 170 that make the voltage at pin 13 of IC 100 equal to a percentage of the voltage at pin 15 of IC 100 when there is no smoke in the smoke chamber that is bounded by cover 44, insulator 28, and part of region 120. Use of some or all of resistive network 170 provides voltage divider ratios of 0.25, 0.33, 0.40, 0.50, 0.60, 0.67, and 0.75. Smoke in the smoke chamber causes a change in conductivity of part of the path between cover 44 and region 120. That change in conductivity changes the voltage at pin 15 of IC 100. An internal comparison of a voltage derived from the voltage at pin 13 with that at pin 15 provides an indication that smoke or combustion products have been detected.

Pins 5, 6 and 7 of IC 100 are supplied with external voltages. Pin 5 is connected to the positive terminal of the battery through resistor 172. Pin 6 is connected directly to the positive terminal of the battery and pin 7 is connected to the positive terminal of the battery through resistor 174.

Transducer 12 is driven by an internal flipflop of IC 100. Pin 10 is connected at location 148 and pin 11 of IC 100 is connected at location 150 to connect the internal flipflop to transducer 12. Pin 8 of IC 100 is a feedback terminal that adjusts the frequency of the internal flipflop to coincide with the mechanical resonant frequency of transducer 12. Pin 8 is connected by resistor 176 to pin 10. Location 150 is connected to pin 8 through capacitor 178. Location 152 is connected to pin 8 through resistor 180. Together, these connectors provide a feedback signal at pin 8 of IC 100.

Timing of the operation of the smoke detector is provided by capacitor 182 which is connected between pin 12 of IC 10 and electrical ground. Capacitor 182 sets the time delay between the detection of smoke and the sounding of an alarm, typically a period of seconds. This timing also sets the period for low-battery checks which are done periodically. With the values of components that are shown below in Table 2 the battery voltage is checked about once every 40 seconds. IC 100 produces a brief audible signal once per 40 seconds with the values of components shown if the battery voltage is below a predetermined value.

The components in the circuit of FIG. 7 are indicated by number in FIG. 4 which shows their placement on PC board 26. Values of the components in FIG. 4 are listed in Table 2 for a circuit that was built for he practice of the present invention.

TABLE 2

| Element | Components of PC Board 26 | |
|---|---|---|
| | Type | Value |
| 100 | IC Chip | Motorola MC 14467 |
| 160 | Capacitor | 10 Microfarads |
| 162 | Resistor | 150 Kilohms |
| 164 | Resistor | 220 Kilohms |
| 166 | Capacitor | 10 Microfarads |
| 168 | Diode | IN 4005 |
| 170 | Resistors | 6, each 8.2 Megohms |
| 172 | Resistor | 820 Ohms |
| 174 | Resistor | 6.8 Megohms |
| 176 | Resistor | 1 Megohm |
| 178 | Capacitor | .001 Microfarads |
| 180 | Resistor | 220 Kilohms |
| 182 | Capacitor | .1 Microfarads |

We claim:

1. In a smoke and fire detector having a housing, a source of ionizing radiation, a smoke chamber, a reference resistance, means for comparing the electrical conductivity of ionized components in the smoke chamber with the electrical conductivity of the reference resistance, and means for sounding an alarm when the difference between the electrical conductivities exceeds a predetermined amount, the improvement comprising:
   a nodal ring that is molded into the housing:
   a piezoelectric transducer formed by depositing piezoelectric material onto a metal disc and disposed on the nodal ring at a mode of oscillation of the transducer to form a part of the means for sounding an alarm;
   a sound-emission aperture formed as a part of the housing and coupled acoustically to the transducer, whereby the means for sounding an alarm is thereby made an integral part of the housing; and
   a retainer that is adapted to snap into engagement with the housing to secure the transducer in physical contact with the nodal ring, the retainer further including a plurality of guides, each adapted to support a spring to make electrical contact with the transducer.

2. In a smoke and fire detector having a housing, a source of ionizing radiation, a smoke chamber, a reference resistance, means for comparing the electrical conductivity of ionized components in the smoke chamber with the electrical conductivity of the reference resistance, and means for sounding an alarm when the difference between the electrical conductivities exceeds a predetermined amount, the improvement comprising:

a reference ion chamber that is the reference resistence, the reference ionization chamber including a reference ionization source and an electrode formed as a conducting region on a printed circuit board; and an insulator adapted to snap into the printed-circuit board and to engage a source plate that forms an electrode of the reference ion chamber and also provides support for the reference ionization source and the source of ionizing radiation on opposite sides of the source plate.

3. In a smoke and fire detector having a housing, a source of ionizing radiation, a smoke chamber, a reference chamber, means for comparing the electrical conductivity of ionized components in the smoke chamber with the electrical conductivity of ionized components in the reference chamber, and means for sounding an alarm when the difference between the electrical conductivities exceeds a predetermined amount, the improvement comprising:

a printed-circuit board that contains electric components including the means for comparing electrical conductivity, the printed-circuit board further including a plurality of electrical conductors disposed to make electrical contact, each with one of a plurality of springs;

a battery holder that forms part of the housing, the battery holder including means for effecting an electrical connection between a battery and the printed-circuit board to supply electrical energy to operate the smoke and fire detector, the battery holder disposed in the housing to allow removal and replacement of the battery holder without detaching the smoke detector from a mounting and without allowing access to the source of ionization radiation, the smoke chamber, the reference resistance, the means for comparing electrical conductivity, or the means for sounding an alarm, the battery holder further including means for effecting electrical connections of the battery holder;

a smoke chamber cover that forms an exterior bound to the smoke chamber, the smoke-chamber cover having an exterior cross-section that is substantially equal in area and shape to an interior cross-section of the housing, the smoke-chamber cover sized to extend to and around the printed-circuit board to provide radio-frequency shielding for the smoke chamber and the reference chamber; and a plurality of openings in the housing and a plurality of openings in the smoke-chamber cover that are aligned to permit substantially equal access from all directions in a plane perpendicular to an axis of symmetry of the housing, the openings in the housing and the openings in the smoke-chamber cover disposed in cooperative engagement to serve as a screen to keep insects for entering the smoke chamber and also to imnpede air flow into the smoke chamber.

4. In a smoke and fire detector having a housing, a source of ionizing radiation, a smoke chamber, a reference chamber, means for comparing the electrical conductivity of ionized components in the smoke chamber with the electrical conductivity of ionized components in the reference chamber, and means for sounding an alarm when the difference between the electrical conductivities exceeds a predetermined amount, the improvement comprising:

a printed-circuit board that contains electric components including the means for comparing electrical conductivity;

a smoke-chamber cover that forms an exterior bound to the smoke chamber, the smoke-chamber cover having an exterior cross-section that is substantially equal in area and shape to an interior cross-section of the housing, the smoke-chamber cover sized to extend to and around the printed-circuit board to provide radio-frequency shielding for the smoke chamber and the reference chamber;

a first strip that is attached as a cantilever to the housing to form a first movable element that is substantially flush with a surface of the housing;

a first tab that is attached to the smoke-chamber cover to form a second movable element that is substantially flush with a surface of the smoke-chamber cover, the first strip and the first tab disposed so that when the first strip is pressed from outside the smoke and fire detector the first tab is caused to move into electrical contact with a first conductor on the printed-circuit board to test the operation of the smoke and fire detector;

a second strip that is attached as a cantilever to the housing to form a third movable element that is substantially flush with a surface of the housing;

a second tab that is attached to the smoke-chamber cover to form a fourth movable element that is substantially flush with a surface of the smoke-chamber cover, the second strip and the second tab disposed so that when the second strip is pressed from outside the smoke and fire detector the second tab is caused to move into electrical contact with a second conductor on the printed-circuit board to test the operation of the smoke and fire detector and then silence an alarm from the smoke and fire detector for a predetermined time;

a capacitor having a first terminal and a second terminal, the first terminal connected to a source of electrical voltage; and a diode having a cathode connected to the second terminal of the capacitor and to the second conductor on the printed-circuit board, the diode having an anode connected to the means for comparing electrical conductivity whereby when the second tab is caused to move into electrical contact with the conductor on the printed-circuit board, the cathode of the diode is grounded to sound an alarm and the capacitor is charged, and when the second tab is released from electrical contact the charged capacitor applies a voltage that silences the smoke and fire detector until the capacitor discharges.

5. In a smoke and fire detector having a housing, a source of ionizing radiation, a smoke chamber a reference chamber, means for comparing electrical conductivity of ionized components in the smoke chamber with electrical conductivity of ionized components in the reference chamber, and means for sounding an alarm when the difference between the electrical conductivities exceeds a predetermined amount, the improvement comprising;

a printed-circuit board that contains electric components including the means for comparing electrical conductivity;

a smoke-chamber cover that forms an exterior bound to the smoke chamber, the smoke-chamber cover having an exterior cross-section that is substantially equal in area and shape to an interior-cross section of the housing, the smoke-chamber cover sized to extend to and around the printed-circuit board to provide radio-frequency shielding for the smoke chamber and reference chamber; and a battery holder that forms part of the housing, the battery holder including means for effecting an electrical connection between a battery and the printed-circuit board to supply electrical energy to operate the smoke and fire detector.

6. The apparatus of claim 5 wherein the battery holder is further disposed in the housing to allow removal and replacement of the battery without detaching the smoke and fire detector from a mounting.

7. The apparatus of claim 6 wherein the battery holder comprises in addition means for effecting electrical connections with the smoke and fire detector automatically upon replacement of the battery holder.

* * * * *